(12) United States Patent
Lee et al.

(10) Patent No.: US 8,331,068 B2
(45) Date of Patent: Dec. 11, 2012

(54) ESD PROTECTION FOR FINFETS

(75) Inventors: Jam-Wem Lee, Zhubei (TW); Andy Lo, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 215 days.

(21) Appl. No.: 12/610,960

(22) Filed: Nov. 2, 2009

(65) Prior Publication Data

US 2010/0296213 A1    Nov. 25, 2010

Related U.S. Application Data

(60) Provisional application No. 61/153,766, filed on Feb. 19, 2009.

(51) Int. Cl.
 *H02H 3/22* (2006.01)
 *H02H 3/20* (2006.01)
 *H02H 9/04* (2006.01)
(52) U.S. Cl. ............ 361/56; 361/111; 361/91.1; 361/54
(58) Field of Classification Search .................... 361/56, 361/111, 91.1, 54
See application file for complete search history.

(56) References Cited

U.S. PATENT DOCUMENTS

| | | | |
|---|---|---|---|
| 5,610,790 A * | 3/1997 | Staab et al. ............. | 361/56 |
| 6,002,568 A * | 12/1999 | Ker et al. ............... | 361/111 |
| 6,074,899 A * | 6/2000 | Voldman ................ | 438/155 |
| 6,144,542 A * | 11/2000 | Ker et al. ............... | 361/111 |
| 6,706,571 B1 | 3/2004 | Yu et al. | |
| 6,784,496 B1 * | 8/2004 | Brodsky et al. ......... | 257/355 |
| 6,826,026 B2 * | 11/2004 | Duvvury et al. ......... | 361/56 |
| 6,858,478 B2 | 2/2005 | Chau et al. | |
| 6,920,026 B2 * | 7/2005 | Chen et al. ............. | 361/56 |
| 6,927,956 B1 * | 8/2005 | Hiraga .................. | 361/56 |
| 7,105,934 B2 | 9/2006 | Anderson et al. | |
| 7,190,050 B2 | 3/2007 | King et al. | |
| 7,247,887 B2 | 7/2007 | King et al. | |
| 7,253,453 B2 * | 8/2007 | Ker et al. ............... | 257/173 |
| 7,265,008 B2 | 9/2007 | King et al. | |
| 7,348,642 B2 * | 3/2008 | Nowak ................. | 257/401 |
| 7,368,354 B2 * | 5/2008 | Anderson et al. ....... | 438/283 |
| 7,407,847 B2 | 8/2008 | Doyle et al. | |

(Continued)

OTHER PUBLICATIONS

Ker, M.-D., et al., "Substrate-Triggered SCR Device for On-Chip ESD Protection in Fully Silicided Sub-0.25-μm CMOS Process," IEEE Transactions on Electron Devices, vol. 50, No. 2, Feb. 2003, pp. 397-405.

(Continued)

*Primary Examiner* — Rexford N Barnie
*Assistant Examiner* — Zeev V Kitov
(74) *Attorney, Agent, or Firm* — Slater & Matsil, L.L.P.

(57) ABSTRACT

An embodiment is a semiconductor device comprising a receiver circuit comprising fin field effect transistors (Fin-FETs), a transceiver circuit comprising FinFETs, and a transmit bus electrically coupling the receiver circuit and the transceiver circuit, wherein the receiver circuit and the transceiver circuit each further comprises an electrostatic discharge protection circuit comprising planar transistors electrically coupled to the transmit bus. Other embodiments may further comprise a power clamp electrically coupling a first power bus and a first ground bus, a power clamp electrically coupling a second power bus and a second ground bus, or at least two diodes electrically cross-coupling the first ground bus and the second ground bus. Also, the planar transistors of the transceiver circuit and the receiver circuit may each comprise a planar PMOS transistor and a planar NMOS transistor.

20 Claims, 1 Drawing Sheet

U.S. PATENT DOCUMENTS

| | | | |
|---|---|---|---|
| 7,508,031 | B2 | 3/2009 | Liu et al. |
| 7,528,465 | B2 | 5/2009 | King et al. |
| 7,535,061 | B2 | 5/2009 | Lee et al. |
| 7,560,785 | B2 | 7/2009 | Yu et al. |
| 7,605,449 | B2 | 10/2009 | Liu et al. |
| 7,687,364 | B2 | 3/2010 | Sell |
| 7,692,907 | B2 * | 4/2010 | Chen et al. ........................ 361/56 |
| 7,838,373 | B2 * | 11/2010 | Giles et al. .................... 438/303 |
| 2005/0153490 | A1 | 7/2005 | Yoon et al. |
| 2007/0120156 | A1 | 5/2007 | Liu et al. |
| 2007/0122953 | A1 | 5/2007 | Liu et al. |
| 2007/0122954 | A1 | 5/2007 | Liu et al. |
| 2007/0128782 | A1 | 6/2007 | Liu et al. |
| 2007/0132053 | A1 | 6/2007 | King et al. |
| 2007/0228372 | A1 | 10/2007 | Yang et al. |
| 2008/0124893 | A1 | 5/2008 | Kim et al. |
| 2008/0258228 | A1 | 10/2008 | Chuang et al. |
| 2008/0263492 | A1 | 10/2008 | Chuang et al. |
| 2008/0290470 | A1 | 11/2008 | King et al. |
| 2008/0296632 | A1 | 12/2008 | Moroz et al. |
| 2009/0035909 | A1 | 2/2009 | Chang et al. |
| 2009/0181477 | A1 | 7/2009 | King et al. |
| 2009/0302372 | A1 | 12/2009 | Chang et al. |
| 2010/0006945 | A1 | 1/2010 | Merelle et al. |
| 2010/0006974 | A1 | 1/2010 | Xu et al. |
| 2010/0052059 | A1 | 3/2010 | Lee |
| 2010/0183961 | A1 | 7/2010 | Shieh et al. |
| 2010/0203734 | A1 | 8/2010 | Shieh et al. |
| 2010/0264468 | A1 | 10/2010 | Xu |

OTHER PUBLICATIONS

Russ, C.C., et al., "ESD Evaluation of the Emerging MuGFET Technology," IEEE Transactions on Device and Materials Reliability, vol. 7, No. 1, Mar. 2007, pp. 152-161.

Pawlak, B. J., "Method of Fabricating FinFET Device," U.S. Appl. No. 12/569,689, Specification and Drawings, Sep. 29, 2009, 24 pages.

Lee, T.-L., et al., "Sacrificial Offset Protection Film for a FinFET Device," U.S. Appl. No. 12/622,038, Specification and Drawings, Nov. 19, 2009, 59 pages.

Su, et al., "Method for Incorporating Impurity Element in EPI Silicon Process," U.S. Appl. No. 12/644,869, Specification and Drawings, Dec. 22, 2009, 24 pages.

Lin, H.-H., et al., "Method of Fabricating a FinFET Device," U.S. Appl. No. 12/703,918, Specification and Drawings, Feb. 11, 2010, 43 pages.

Gan, T.-C., et al., "Hybrid Gate Process for Fabricating FinFET Device", U.S. Appl. No. 12/756,662, Specification and Drawings, Apr. 8, 2010, 47 pages.

Shen, J.-J., et al., "FinFET Boundary Optimization," U.S. Appl. No. 12/780,426, Specification and Drawings, May 14, 2010, 34 pages.

Shen, J.-J., et al., "Automatic Layout Conversion for FinFET Device," U.S. Appl. No. 12/780,060, Specification and Drawings, May 14, 2010, 35 pages.

Cheng, M.-L., et al., "Method and Apparatus for Enhancing Channel Strain," U.S. Appl. No. 12/780,124, Specification and Drawings, May 14, 2010, 40 pages.

Xu, J. J., "Method of Forming EPI Film in Substrate Trench," U.S. Appl. No. 12/784,207, Specification and Drawings, May 20, 2010, 36 pages.

Liaw, J. J., "Structure and Method for SRAM Cell Circuit," U.S. Appl. No. 12/823,860, Specification and Drawings, Jun. 25, 2010, 38 pages.

Liaw, J. J., "Cell Structure for Dual-Port SRAM," U.S. Appl. No. 12/823,907, Specification and Drawings, Jun. 25, 2010, 47 pages.

Liaw, J. J., "ROM Cell Circuit for FinFET Devices," U.S. Appl. No. 12/827,406, Specification and Drawings, Jun., 30, 2010, 30 pages.

Liaw, J. J., "Layout for Multiple-Fin SRAM Cell," U.S. Appl. No. 12/827,690, Specification and Drawings, Jun. 30, 2011, 40 pages.

Lim, P.-S., et al, "Gate Structures and Method of Fabricating Same," U.S. Appl. No. 12/827,512, Specification and Drawings, Jun. 30, 2011, 47 pages.

Perng, T.H., et al., "Fin-Like Field Effect Transistor (FinFET) Device and Method of Manufacturing Same," U.S. Appl. No. 12/837,093, Specification and Drawings, Jul. 15, 2010, 36 pages.

Wann, C. H., et al., "In-Situ Spectrometry," U.S. Appl. No. 12/834,617, Specification and Drawings, Jul. 12, 2010, 26 pages.

Huang, Y.-H., et al., "High Surface Dopant Concentration Semiconductor Device and Method of Fabricating," U.S. Appl. No. 12/840,830, Specification and Drawings, Jul. 21, 2010, 28 pages.

Chen, C.-C., et al., "Gate Controlled Bipolar Junction Transistor on Fin-Like Field Effect Transistor (FinFET) Structure," U.S. Appl. No. 12/871,476, Specification and Drawings, Aug. 30, 2010, 36 pages.

Van Dal, M., "Method of Fabricating a Semiconductor Device Having an Epitaxy Region," U.S. Appl. No. 12/900,895, Specification and Drawings, Oct. 8, 2010, 26 pages.

Chang, C.-H., et al., "Fin-Like Field Effect Transistor (FinFET) Device and Method of Manufacturing Same," U.S. Appl. No. 12/906,820, Specification and Drawings, Oct. 18, 2010, 60 pages.

Chen, H.-C., et al., "Multi-Fin Device by Self-Aligned Castle Fin Information," U.S. Appl. No. 12/907,272, Specification and Drawings, Oct. 19, 2010, 40 pages.

Xu, J. J., et al., "Fin-Like Field Effect Transistor (FinFET) Device and Method of Manufacturing Same," U.S. Appl. No. 12/917,902, Specification and Drawings, Nov. 2, 2010, 66 pages.

Wang, C.-H., et al., "Method for Forming Metrology Structures from Fins in Integrated Circuitry," U.S. Appl. No. 12/949,881, Nov. 19, 2010. 22 pages.

Wang, C.-H., et al., "Method for Adjusting Fin Width in Integrated Circuitry," U.S. Appl. No. 12/952,376, Nov. 23, 2010, 33 pages.

Wang, C.-H., et al., "Device and Method for Forming Fins in Integrated Circuitry," U.S. Appl. No. 12/953,148, Nov. 23, 2010, 45 pages.

* cited by examiner

ESD PROTECTION FOR FINFETS

This application claims the benefit of U.S. Provisional Patent Application Ser. No. 61/153,766, filed on Feb. 19. 2009, and entitled "ESD Protection for FinFETs," which application is incorporated herein by reference.

TECHNICAL FIELD

The present invention relates generally to a circuit for electrostatic discharge (ESD) protection, and more particularly to a circuit for cross-domain protection of fin field effect transistors (FinFETs) in a semiconductor chip during a charged device mode (CDM) discharge.

BACKGROUND

Fin field effect transistors (FinFETs) continue to be used more often in semiconductor technology as the size of technology decreases. Unfortunately, FinFETs are generally more susceptible to device failures from electrostatic discharge (ESD) events because of their relatively small channel width. Therefore, a solution is needed to overcome this problem.

FinFETs are considered three-dimensional transistors because of their physical structure. The active area of the FinFET—the drain, channel, and source—protrude up from the surface of the semiconductor substrate upon which the FinFET is located, much like a rectangular box. Also, the gate structure wraps around the channel, usually on three sides but sometimes on two sides.

FinFETs are advantageous in smaller technologies because of their relatively higher drive current when compared to devices of similar size and because of their general ability to prevent short-channel effects. FinFETs generally have increased drive currents because the gate wraps around the channel such that the effective width of the channel is increased. The increased channel width allows for a greater drive current. Further, by having the gate wrap around the channel, the gate can suppress leakage current through the channel more easily, thus decreasing short channel effects.

The advantages of FinFETs have led to their use in smaller technologies, particularly 32 nm and smaller, but the trade-off for smaller size has led to an increased susceptibility of failure for FinFETs during ESD events. The active area width of a FinFET is much smaller than that of another device of corresponding technology size. The smaller width leads to increased current density in the FinFET when an ESD event occurs. For example, FinFETs typically have a maximum of 0.1 mA/µm before device breakdown occurs as compared to approximately 2 mA/µm for planar bulk MOSFETs or approximately 1.4 mA/µm for planar SOI MOSFETs. This increased current density may cause the dielectric gate oxide to breakdown between the active area and the gate causing a short between the gate and the active area. Thus, the FinFET may experience complete failure.

ESD events are generally categorized into three different modes, the Human Body Mode (HBM), the Machine Mode (MM), and the Charged Device Mode (CDM). In HBM, generally a person will have a charge stored on him or her. Then the person will touch a pin on a semiconductor package discharging the stored charged onto the semiconductor chip. Ideally, circuitry within the chip will conduct the current away from the internal devices on the chip and drain the current to ground. HBM is generally the lowest magnitude of voltage of the three modes, but usually the longest in duration. Similar to HBM, in MM, a machine, usually considered to be a metal machine, will have a charge stored on it. The machine will contact a pin of a semiconductor package discharging the stored charge. Again, internal circuitry should conduct the current away from components in the chip and to ground. MM is usually between HBM and CDM in magnitude of voltage and duration. In CDM, a charge will build up on the chip itself. The internal circuitry of the chip attempts to direct the current to some power bus such that the current can then be directed away from other internal devices of the chip and drained away to a pin on the package. CDM is typically the highest voltage magnitude with the shortest duration of discharge.

During this CDM discharge is when FinFETs are most susceptible to device failure because of the high voltage magnitude discharged during the ESD event. Thus, there is a need in the prior art for a device to protect FinFETs during CDM ESD events.

SUMMARY OF THE INVENTION

These and other problems are generally solved or circumvented, and technical advantages are generally achieved, by embodiments of the present invention.

In accordance with an embodiment of the present invention, a semiconductor device comprises a transceiver circuit comprising fin field effect transistors (FinFETs) and a first ground bus, a receiver circuit comprising FinFETs and a second ground bus, and a transmit bus electrically coupling the receiver circuit and the transceiver circuit. The receiver circuit and the transceiver circuit each further comprises an electrostatic discharge (ESD) protection circuit comprising planar transistors electrically coupled to the transmit bus.

In accordance with another embodiment of the present invention, a semiconductor device comprises a transmit bus, a transceiver, and a receiver. The transceiver comprises a first power bus, a first ground bus, transceiver operational circuitry comprising FinFETs electrically coupled to the transmit bus, and a transceiver ESD protection circuit comprising planar transistors, wherein a first planar transistor electrically couples the transmit bus and the first power bus and a second planar transistor electrically couples the transmit bus and the first ground bus. The receiver comprises a second power bus, a second ground bus, receiver operational circuitry comprising FinFETs electrically coupled to the transmit bus, and a receiver ESD protection circuit comprising planar transistors, wherein a third planar transistor electrically couples the transmit bus and the second power bus and a fourth planar transistor electrically couples the transmit bus and the second ground bus.

In accordance with another embodiment of the present invention, a method for forming a semiconductor device comprises electrically coupling transceiver operational circuitry between a first power bus and a first ground bus, electrically coupling receiver operational circuitry between a second power bus and a second ground bus, electrically coupling a transmit bus between the transceiver operational circuitry and the receiver operational circuitry, providing a first electrostatic discharge (ESD) protection circuit, providing a second ESD protection circuit, and providing an external contact to discharge the current created by an electrostatic discharge event. The external contact is electrically coupled to a bus—either the first power bus, the first ground bus, the second power bus, or the second ground bus. The transceiver operational circuitry and the receiver operational circuitry each comprises one or more fin field effect transistors. The first ESD protection circuit is electrically coupled to the first power bus, the first ground bus, and the transmit bus. The second ESD protection circuit is electrically coupled to the second power bus, the second ground bus, and the transmit bus. The first ESD protection circuit and the second ESD protection circuit each comprises one or more planar transistors.

An advantage of an embodiment of the present invention is that the robustness of the active areas of the planar transistors as compared to the active areas of FinFETs allow much more current to circumvent the FinFETs on the semiconductor chip. Thus, the likelihood that FinFETs used in smaller technologies will fail from an ESD event will decrease.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

Figure 1:
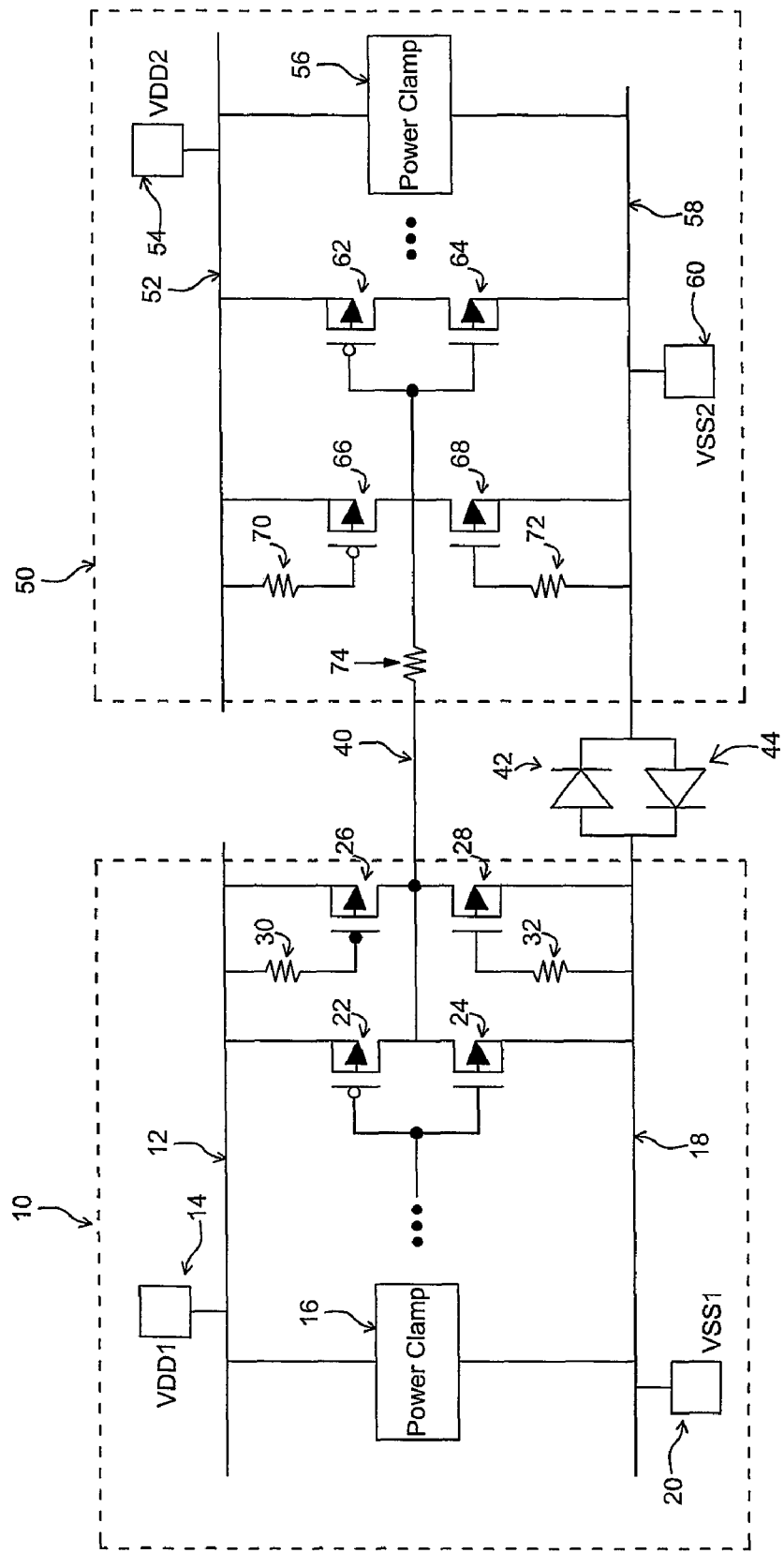
FIG. 1 is a transceiver circuit and a receiver circuit, both with cross-domain ESD protection, in accordance with an embodiment of the invention.

The making and using of the present embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely a circuit for cross-domain protection of FinFETs in a CDM ESD event. The invention may also be applied, however, to other transistor devices and other ESD events without limitation.

Before using FinFETs became widespread, ESD cross-domain protection on transceiver circuitry on a semiconductor chip was thought to be unnecessary because the active areas of the devices were sufficient to withstand the current created by the ESD event; ESD protection was only provided on receiver circuitry to protect transistor gate oxides. However, as discussed above, FinFET active areas in transceiver circuitry typically cannot withstand the current created by a CDM ESD event. This causes failures of FinFETs in the transceiver circuit.

FIG. 1 illustrates a transceiver circuit 10 and a receiver circuit 50, both with cross-domain ESD protection, in accordance with an embodiment of the invention. The transceiver circuit 10 comprises a first voltage source VDD1 bus 12 and external contact 14, a first ground VSS1 bus 18 and external contact 20, and a power clamp 16 coupled between the VDD1 bus 12 and the VSS1 bus 18. An inverter is coupled to other operational circuitry (not shown) within the transceiver circuit 10 and between the VDD1 bus 12 and the VSS1 bus 18. The inverter comprises a PMOS FinFET 22 and an NMOS FinFET 24. The source of the PMOS FinFET 22 is coupled to the VDD1 bus 12 and the source of the NMOS FinFET 24 is coupled to the VSS1 bus 18. The gates of the PMOS FinFET 22 and the NMOS FinFET 24 are coupled to other operational circuitry (not shown) within the transceiver circuit 10. The drains of the PMOS FinFET 22 and the NMOS FinFET 24 are coupled together and to a transmit bus 40. The transceiver circuit 10 also comprises a CDM protection scheme comprising a planar PMOSFET 26 and a planar NMOSFET 28. The source of the planar PMOSFET 26 is coupled to the VDD1 bus 12, and the gate of the planar PMOSFET 26 is coupled to the VDD1 bus 12 through a resistor 30. The source of the planar NMOSFET 28 is coupled to the VSS1 bus 18, and the gate of the planar NMOSFET 28 is coupled to the VSS1 bus 18 through a resistor 32.

The receiver circuit 50 comprises a second voltage source VDD2 bus 52 and external contact 54, a second ground VSS2 bus 58 and external contact 60, and a power clamp 56 coupled between the VDD2 bus 52 and the VSS2 bus 58. An inverter is coupled to other operational circuitry (not shown) within the receiver circuit 50 and between the VDD2 bus 52 and the VSS2 bus 58. The inverter comprises a PMOS FinFET 62 and an NMOS FinFET 64. The source of the PMOS FinFET 62 is coupled to the VDD2 bus 52 and the source of the NMOS FinFET 64 is coupled to the VSS2 bus 58. The gates of the PMOS FinFET 62 and the NMOS FinFET 64 are coupled to a resistor 74 coupled to the transmit bus 40. The drains of the PMOS FinFET 62 and the NMOS FinFET 64 are coupled together and to other operational circuitry (not shown) in the receiver circuit 50. The receiver circuit 50 also comprises a CDM protection scheme comprising a planar PMOSFET 66 and a planar NMOSFET 68. The source of the planar PMOSFET 66 is coupled to the VDD2 bus 52, and the gate of the planar PMOSFET 66 is coupled to the VDD2 bus 52 through a resistor 70. The source of the planar NMOSFET 58 is coupled to the VSS2 bus 58, and the gate of the planar NMOSFET 58 is coupled to the VSS2 bus 58 through a resistor 72.

The VSS1 bus 18 and the VSS2 bus 58 are coupled through cross-coupling diodes. Diode 42 has its anode coupled to the VSS1 bus 18 and its cathode to the VSS2 bus 58. Conversely, diode 44 has its anode coupled to the VSS2 bus 58 and its cathode to the VSS1 bus 18.

A person having ordinary skill in the art will recognize that the circuitry in FIG. 1 is usually disposed on a semiconductor die that is housed in a package. The external contacts 14, 20, 54, and 60 may represent contact pads of the semiconductor die and/or package, for example, a bump bond pad in a flip chip assembly or a wire bond pad in a wire bonding assembly. These external contacts 14, 20, 54, and 60 are generally electrically coupled to various external package pins on the package through different interconnect structures.

A chip can be designed such that the charge that is discharged during the ESD event will discharge through any pin on the chip package, but with respect to FIG. 1, VDD1 external contact 14 is assumed to be electrically coupled to the package pin that drains the ESD charge. Other external contacts 20, 54, and 60 are electrically coupled to the package pin to drain the ESD charge in other embodiments. In these other embodiments, a person having ordinary skill in the art will realize the differences in the current flow and operation of different components during ESD events from what is described below. Further, the ESD protection discussed with regard to FIG. 1 applies particularly to cross-domain protection, even though it is not so limited. Therefore, with respect to FIG. 1, only cross-domain protection is discussed such that the charge is assumed to originate in the receiver circuitry 50.

Assuming a positive CDM ESD event originates on or near the VDD2 bus 52, the planar PMOSFETs 26 and 66 will operate to drain some of the current caused by the ESD event away through the VDD1 bus 12 and external contact 14. When the high positive voltage is suddenly discharged on the VDD2 bus 52, the planar PMOSFET 66 will go into a snap-back mode, or avalanche breakdown, causing a near short through the planar PMOSFET 66. The current will travel from the VDD2 bus 52, through the planar PMOSFET 66, through the resistor 74, and onto the transmit bus 40. Thus, the transmit bus 40 will be at a high voltage causing the planar PMOSFET 26 to operate in the saturation mode to conduct the current to the VDD1 bus 12 and out to the VDD1 external contact 14. This current flow through the planar PMOSFETs 26 and 66 and the resistor 74 causes a voltage drop between the VDD1 bus 12 and the VDD2 bus 52 with the VDD2 bus 52 being at a significantly higher voltage. Because the VDD2 bus 52 is at a higher voltage, the power clamp 56 will operate to conduct current to the VSS2 bus 58. This current will forward bias the diode 44 to conduct current to the VSS1 bus 18. This will cause the VSS1 bus 18 to be at a higher voltage than VDD1 bus 12 and will cause the power clamp 16 to operate to conduct current to the VDD1 bus 12. Thus, the planar PMOSFETs 26 and 66 prevent most of the current from the ESD event from flowing through any FinFETs in either the receiver circuit 50 or transceiver circuit 10.

Assuming a negative CDM ESD event originates on or near the VDD2 bus 52, the circuits operate similarly to the positive CDM ESD event except the current flows in the opposite direction and the planar PMOSFETs 26 and 66 operation modes are switched. When the negative ESD event occurs, the planar PMOSFET 66 is saturated and the planar PMOSFET 26 is in snap-back mode. A current will flow from the VDD1 external contact 14 to the VDD1 bus 12 through the planar PMOSFET 26 onto the transmit bus 40 through the resistor 74 and planar PMOSFET 66 to the VDD2 bus 52. Again, a voltage drop occurs between the VDD1 bus 12 and the VDD2 bus 52 causing the power clamps 16 and 56 to operate and conduct current through the power clamp 16, the VSS1 bus 18, the forward biased diode 42, the VSS2 bus 58, and the power clamp 56 to the ESD discharge on the VDD2 bus 52. Again, current is prevented from flowing through the FinFETs.

Assuming a positive CDM ESD event originates on or near the VSS2 bus 58, the planar NMOSFET 68 and the planar PMOSFET 26 will operate to drain some of the current caused by the ESD event away through the VDD1 bus 12 and external contact 14. When the high positive voltage is discharged on the VSS2 bus 58, the planar NMOSFET 68 will operate in saturation mode. The current will travel from the VSS2 bus 58 through the planar NMOSFET 68, through the resistor 74, and onto the transmit bus 40. Thus, the transmit bus 40 will be at a high voltage causing the planar PMOSFET 26 to operate in the saturation mode to conduct the current to the VDD1 bus 12 and out to the VDD1 external contact 14. Further, a second current path will occur. Current will also flow away from the VSS2 bus through the forward biased diode 44 to the VSS1 bus 18. The VSS1 bus 18 will then be at a higher voltage than the VDD1 bus 12 causing the power clamp 16 to operate to conduct current to the VDD1 bus 12 and out the external contact 14. Again, current is prevented from flowing through the FinFETs.

Assuming a negative CDM ESD event originates on or near the VSS2 bus 58, the circuits operate similarly to the positive CDM ESD event except the current flows in the opposite direction and the planar PMOSFET 26 and the planar NMOSFET 68 operation modes are switched. When the negative ESD event occurs, the planar NMOSFET 68 and the planar PMOSFET 26 are in snap-back mode. A current will flow from the VDD1 external contact 14 to the VDD1 bus 12 through the planar PMOSFET 26 onto the transmit bus 40 through the resistor 74 and planar NMOSFET 68 to the VSS2 bus 58. Again, a second current path will occur. Current will also flow to the VSS2 bus through the forward biased diode 42 from the VSS1 bus 18. The VSS1 bus 18 will then be at a much lower voltage than the VDD1 bus 12 causing the power clamp 16 to operate to conduct current from the VDD1 bus 12 and the external contact 14. Again, current is prevented from flowing through the FinFETs.

The embodiment represented in FIG. 1 exemplifies how FinFETs on a semiconductor chip can be protected. The robustness of the active areas of the planar MOSFETs as compared to the active areas of FinFETs allow much more current to circumvent the FinFETs on the semiconductor chip. The embodiment is particularly useful in 32 nm technologies and smaller. Thus, the likelihood that FinFETs used in these technologies will fail from an ESD event will decrease.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
   a transceiver circuit comprising fin field effect transistors (FinFETs) and a first ground bus;
   a receiver circuit comprising FinFETs and a second ground bus; and
   a transmit bus electrically coupling the receiver circuit and the transceiver circuit, wherein the receiver circuit and the transceiver circuit each further comprises an electrostatic discharge protection circuit comprising planar transistors electrically coupled to the transmit bus.

2. The semiconductor device of claim 1, wherein the planar transistors of the transceiver circuit comprise a planar PMOS transistor and a planar NMOS transistor.

3. The semiconductor device of claim 2, wherein the planar PMOS transistor has a source and a gate each electrically coupled to a first power bus and a source electrically coupled to the transmit bus, and wherein the planar NMOS has a source and a gate each electrically coupled to the first ground bus and a drain electrically coupled to the transmit bus.

4. The semiconductor device of claim 3, wherein a first resistor is interposed between the first power bus and the gate of the planar PMOS transistor, and wherein a second resistor is interposed between the first ground bus and the gate of the planar NMOS transistor.

5. The semiconductor device of claim 3, wherein a power clamp electrically couples the first power bus and the first ground bus.

6. The semiconductor device of claim 1, wherein the planar transistors of the receiver circuit comprise a planar PMOS transistor and a planar NMOS transistor.

7. The semiconductor device of claim 6, wherein the planar PMOS transistor has a source and a gate each electrically coupled to a second power bus and a source electrically coupled to the transmit bus, and wherein the planar NMOS has a source and a gate each electrically coupled to the second ground bus and a drain electrically coupled to the transmit bus.

8. The semiconductor device of claim 7, wherein a first resistor is interposed between the second power bus and the gate of the planar PMOS transistor, and wherein a second resistor is interposed between the second ground bus and the gate of the planar NMOS transistor.

9. The semiconductor device of claim 7, wherein a power clamp electrically couples the second power bus and the second ground bus.

10. The semiconductor device of claim 1, wherein at least two diodes electrically cross-couple the first ground bus and the second ground bus.

11. A semiconductor device comprising:
  a transmit bus;
  a transceiver comprising:
    a first power bus;
    a first ground bus;
    transceiver operational circuitry comprising fin field effect transistors electrically coupled to the transmit bus;
    a transceiver electrostatic discharge (ESD) protection circuit comprising planar transistors, wherein a first planar transistor of the transceiver ESD protection circuit electrically couples the transmit bus to the first power bus and a second planar transistor of the transceiver ESD protection circuit electrically couples the transmit bus to the first ground bus;
  a receiver comprising:
    a second power bus;
    a second ground bus;
    receiver operational circuitry comprising fin field effect transistors electrically coupled to the transmit bus; and
    a receiver electrostatic discharge (ESD) protection circuit comprising planar transistors, wherein a third planar transistor of the receiver ESD protection circuit electrically couples the transmit bus to the second power bus and a fourth planar transistor of the receiver ESD protection circuit electrically couples the transmit bus to the second ground bus.

12. The semiconductor device of claim 11, further comprising:
  a first power clamp electrically coupling the first power bus to the first ground bus; and
  a second power clamp electrically coupling the second power bus to the second ground bus.

13. The semiconductor device of claim 11, wherein cross-coupled diodes electrically couple the first ground bus to the second ground bus.

14. The semiconductor device of claim 11, wherein the first planar transistor comprises a first planar PMOS transistor, the second planar transistor comprises a second planar NMOS transistor, the third planar transistor comprises a third planar PMOS transistor, and the fourth planar transistor comprises a fourth planar NMOS transistor.

15. The semiconductor device of claim 14, wherein a gate and a source of the first planar PMOS transistor are electrically coupled to the first power bus, a drain of the first planar PMOS transistor and a drain of the second planar NMOS transistor are electrically coupled to the transmit bus, and a gate and a source of the second planar NMOS transistor are electrically coupled to the first ground bus, and wherein a gate and a source of the third planar PMOS transistor are electrically coupled to the second power bus, a drain of the third planar PMOS transistor and a drain of the fourth planar NMOS transistor are electrically coupled to the transmit bus, and a gate and a source of the fourth planar NMOS transistor are electrically coupled to the second ground bus.

16. A method for forming a semiconductor device, the method comprising:
  electrically coupling transceiver operational circuitry between a first power bus and a first ground bus, wherein the transceiver operational circuitry comprises one or more fin field effect transistors;
  electrically coupling receiver operational circuitry between a second power bus and a second ground bus, wherein the receiver operational circuitry comprises one or more fin field effect transistors;
  electrically coupling a transmit bus between the transceiver operational circuitry and the receiver operational circuitry;
  providing a first electrostatic discharge (ESD) protection circuit electrically coupled to the first power bus, the first ground bus, and the transmit bus, wherein the first ESD protection circuit comprises one or more planar transistors;
  providing a second ESD protection circuit electrically coupled to the second power bus, the second ground bus, and the transmit bus, wherein the second ESD protection circuit comprises one or more planar transistors; and
  providing an external contact to discharge the current created by an electrostatic discharge event, the external contact being electrically coupled to a bus, wherein the bus is either the first power bus, the first ground bus, the second power bus, or the second ground bus.

17. The method of claim 16, further comprising:
  electrically coupling a first power clamp between the first power bus and the first ground bus; and
  electrically coupling a second power clamp between the second power bus and the second ground bus.

18. The method of claim 16, further comprising electrically coupling cross-coupled diodes between the first ground bus and the second ground bus.

19. The method of claim 16, wherein the one or more planar transistors of the first ESD protection circuit comprise a first planar PMOS transistor electrically coupling the first power bus to the transmit bus and a second planar NMOS transistor electrically coupling the transmit bus to the first ground bus, and wherein the one or more planar transistors of the second ESD protection circuit comprise a third planar PMOS transistor electrically coupling the second power bus to the transmit bus and a fourth planar NMOS transistor electrically coupling the transmit bus to the second ground bus.

20. The method of claim 19, wherein a source and a gate of the first planar PMOS transistor are electrically coupled to the first power bus, a drain of the first planar PMOS and a drain of the second planar NMOS are electrically coupled to the transmit bus, and a source and a gate of the second planar NMOS transistor are electrically coupled to the first ground bus, and wherein a source and a gate of the third planar PMOS transistor are electrically coupled to the second power bus, a drain of the third planar PMOS and a drain of the fourth planar NMOS are electrically coupled to the transmit bus, and a source and a gate of the fourth planar NMOS transistor are electrically coupled to the second ground bus.

* * * * *